United States Patent
Ando et al.

(10) Patent No.: US 8,404,530 B2
(45) Date of Patent: Mar. 26, 2013

(54) REPLACEMENT METAL GATE WITH A CONDUCTIVE METAL OXYNITRIDE LAYER

(75) Inventors: Takashi Ando, Tuckahoe, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/177,692

(22) Filed: Jul. 7, 2011

(65) Prior Publication Data

US 2013/0009257 A1    Jan. 10, 2013

(51) Int. Cl.
*H01L 21/338*    (2006.01)
(52) U.S. Cl. .................... 438/183; 257/E21.444
(58) Field of Classification Search .................. 257/411, 257/E21.444
See application file for complete search history.

(56) References Cited

U.S. PATENT DOCUMENTS

| | | | | |
|---|---|---|---|---|
| 5,716,881 | A * | 2/1998 | Liang et al. | 438/238 |
| 6,919,251 | B2 * | 7/2005 | Rotondaro et al. | 438/287 |
| 7,611,979 | B2 | 11/2009 | Callegari et al. | |
| 7,732,344 | B1 * | 6/2010 | Tsai et al. | 438/734 |
| 7,776,757 | B2 | 8/2010 | Lin et al. | |
| 8,048,733 | B2 * | 11/2011 | Yeh et al. | 438/199 |
| 8,062,966 | B2 * | 11/2011 | Mehrad et al. | 438/592 |
| 8,153,498 | B2 * | 4/2012 | Hsu et al. | 438/382 |
| 2010/0068875 | A1 * | 3/2010 | Yeh et al. | 438/587 |
| 2010/0078733 | A1 * | 4/2010 | Masuoka et al. | 257/384 |
| 2010/0127336 | A1 * | 5/2010 | Chambers et al. | 257/369 |
| 2010/0261342 | A1 | 10/2010 | Clark et al. | |

OTHER PUBLICATIONS

Chudzik, M. et al., "High-Performance High-K/Metal Gates for 45nm CMOS and Beyond with Gate-First Processing" IEEE Symposium on VLSI Technology (Jun. 12-14, 2007) pp. 194-195.
Lai, C.M. et al., "A Novel "Hybrid" High-K/Metal Gate Process for 28nm High Performance CMOSFETs" IEEE International Electron Devices Meeting (IEDM) (Dec. 7-9, 2009) 4 pages.
Cartier, E. et al., "pFET Vt Control with HfO2/TiN/poly-Si Gate Stack Using a Lateral Oxygenation Process" Symposium on VLSI Technology (Jun. 16-18, 2009) pp. 42-43.
Cartier, E. et al., "Oxygen Passivation of Vacancy Defects in Metal-Nitride Gated HfO2/SiO2/Si Devices" Applied Physics Letters (Jul. 2009) pp. 042901-1-042901-3, vol. 95.
Li, Z. et al., "Oxygen Incorporation in TiN for Metal Gate Work Function Tuning with a Replacement Gate Integration Approach" Microelectronic Engineering (Nov. 2010) pp. 1805-1807, vol. 87, Issue 9.

* cited by examiner

*Primary Examiner* — Thao P. Le
(74) *Attorney, Agent, or Firm* — Scully, Scott, Murphy & Presser, P.C.; Vazken Alexaniari

(57) ABSTRACT

A disposable gate structure and a gate spacer are formed on a semiconductor substrate. A disposable gate material portion is removed and a high dielectric constant (high-k) gate dielectric layer and a metal nitride layer are formed in a gate cavity and over a planarization dielectric layer. The exposed surface portion of the metal nitride layer is converted into a metal oxynitride by a surface oxidation process that employs exposure to ozonated water or an oxidant-including solution. A conductive gate fill material is deposited in the gate cavity and planarized to provide a metal gate structure. Oxygen in the metal oxynitride diffuses, during a subsequent anneal process, into a high-k gate dielectric underneath to lower and stabilize the work function of the metal gate without significant change in the effective oxide thickness (EOT) of the high-k gate dielectric.

10 Claims, 8 Drawing Sheets

REPLACEMENT METAL GATE WITH A CONDUCTIVE METAL OXYNITRIDE LAYER

BACKGROUND

The present disclosure relates to semiconductor structures, and particularly to a metal-oxide-semiconductor field effect transistor (MOSFET) having a metal gate and methods of manufacturing the same.

Controlling the threshold voltage of a metal-oxide-semiconductor field effect transistor (MOSFET) is one of the challenges in manufacturing a metal gate MOSFET. Especially, providing a low threshold voltage for a p-type MOSFET having a metal gate has proven to be difficult for the gate first integration scheme, i.e., the conventional integration scheme in which the gate material is not subsequently replaced.

The gate last integration scheme that employs a replacement gate remains an alternative. However, obtaining a material that provides effective work function corresponding to the valence band edge of silicon is still challenging.

Efforts to alter the work function of a metal layer by conventional thermal oxidation have resulted in an increase in effective oxide thickness (EOT), which degrades the performance of a metal gate MOSFET. In order to provide optimal performance for a metal gate MOSFET, however, a combination of a metal gate material and a gate dielectric is required such that the metal gate material has a work function near a band gap edge of an underlying semiconductor material and the gate dielectric does not suffer from increase in EOT during processing sequences.

BRIEF SUMMARY

A disposable gate structure and a gate spacer are formed on a semiconductor substrate. A disposable gate material portion is removed and a high dielectric constant (high-k) gate dielectric layer and a metal nitride layer are formed in a gate cavity and over a planarization dielectric layer. The exposed surface portion of the metal nitride layer is converted into a metal oxynitride by a surface oxidation process that employs exposure to ozonated water or an oxidant-including solution. A conductive gate fill material is deposited in the gate cavity and planarized to provide a metal gate structure. Oxygen in the metal oxynitride diffuses, during a subsequent anneal process, into a high-k gate dielectric underneath to lower and stabilize the work function of the metal gate without significant change in the effective oxide thickness (EOT) of the high-k gate dielectric.

According to an aspect of the present disclosure, a method of forming a semiconductor structure is provided, which includes: forming a disposable gate structure and a planarization dielectric layer on a semiconductor substrate; forming a gate cavity by removing the disposable gate structure selective to the planarization dielectric layer; forming a gate dielectric layer in the gate cavity and over a top surface of the planarization dielectric layer; forming a metal nitride layer on the gate dielectric layer; and converting a surface layer of the metal nitride layer into a metal oxynitride layer, wherein a stack of the metal oxynitride layer and a thinned metal nitride layer having a lesser thickness than the metal nitride layer is formed.

According to another aspect of the present disclosure, a semiconductor structure including a field effect transistor is provided. The field effect transistor includes a gate electrode, which includes: a U-shaped metal nitride layer; a U-shaped metal oxynitride layer contacting inner sidewalls of the U-shaped metal nitride layer; and a conductive metal portion located within the U-shaped metal oxynitride.

DETAILED DESCRIPTION

Figure 1:
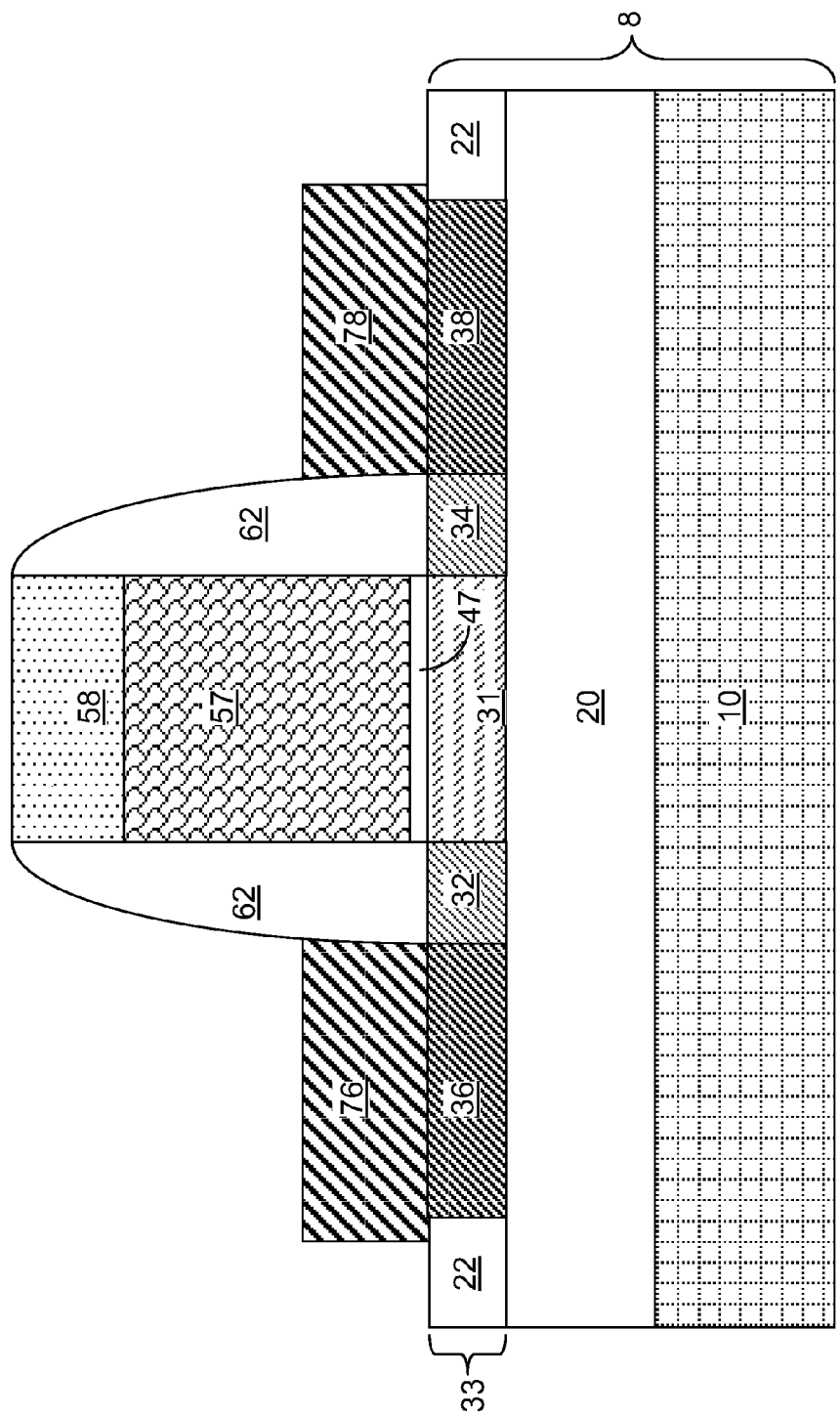
FIG. 1 is vertical cross-sectional view of an exemplary semiconductor structure after formation of a disposable gate stack structure, a gate spacer, and raised source and drain regions according to an embodiment of the present disclosure.

As stated above, the present disclosure relates to a metal-oxide-semiconductor field effect transistor (MOSFET) having a metal gate and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, an exemplary semiconductor structure according to an embodiment of the present disclosure includes a semiconductor substrate 8, which can be a semiconductor-on-insulator (SOI) substrate including a stack, from bottom to top, of a handle substrate 10, a buried insulator layer 20, and a semiconductor layer including a top semiconductor layer 33.

The handle substrate 10 can be a semiconductor substrate including a single crystalline semiconductor material such as single crystalline silicon, a polycrystalline semiconductor material, an amorphous semiconductor material, or a stack thereof. The thickness of the handle substrate 10 can be from 50 microns to 1,000 microns, although lesser and greater thicknesses can also be employed. The buried insulator layer 20 includes a dielectric material such as silicon oxide, silicon nitride, silicon oxynitride, or a combination thereof. The thickness of the buried insulator layer 20 can be form 50 nm to 500 nm, although lesser and greater thicknesses can also be employed. The thickness of the top semiconductor layer 33 can be from 3 nm to 60 nm, and typically from 5 nm to 10 nm, although lesser and greater thicknesses can also be employed.

The top semiconductor layer 33 includes various single crystalline semiconductor portions, which can include, for example, a body region 31, a source extension region 32, a drain extension region 34, a planar source region 36, and a planar drain region 38. Shallow trench isolation structures 22 can be formed the top semiconductor layer 33 employing methods known in the art, e.g., by forming trenches extending from the top surface of the top semiconductor layer 33 at least to the top surface of the buried insulator layer 20, filling the trenches with a dielectric material, and removing excess dielectric material from above the top surface of the top semiconductor layer 33.

The various single crystalline semiconductor portions (31, 32, 34, 36, 38) in the top semiconductor layer 33 can be formed by introducing electrical dopants such as B, Ga, In, P, As, and/or Sb by ion implantation, plasma doping, and/or gas phase doping employing various masking structures as known in the art. Before implanting electrical dopants into various portions of the top semiconductor layer 33, a disposable gate stack structure is formed. The disposable gate stack structure can include, for example, a vertical stack, from bottom to top, of a disposable gate dielectric 47, a disposable gate material portion 57, and a disposable gate cap dielectric 58.

The disposable gate dielectric 47 includes a dielectric material that can function as an etch stop layer during subsequent removal of the disposable gate material portion 57. For example, the disposable gate dielectric 47 can include silicon oxide, silicon nitride, silicon oxynitride, or a combination thereof. The disposable gate material portion 57 includes a material that can be removed selective to the disposable gate dielectric 47 and a gate spacer 62, which includes a dielectric material such as silicon oxide, silicon nitride, silicon oxynitride, or a combination thereof. The disposable gate cap dielectric 58 includes a dielectric material that can be removed selective to the gate spacer 62. For example, the disposable gate dielectric 47 and the gate spacer 62 can include silicon oxide and the disposable gate cap dielectric 58 can include silicon nitride, or vice versa. The thickness of the disposable gate stack structure (47, 57, 58) can be from 50 nm to 500 nm, although lesser and greater thicknesses can also be employed.

The source extension region 32 and the drain extension region 34 can be formed, for example, by introducing electrical dopants into exposed semiconductor portions in the top semiconductor layer 33 employing the disposable gate stack structure (47, 57, 58) as a masking layer. If the body portion 31 has a doping of a first conductivity type, the source extension region 32 and the drain extension region 34 have a doping of a second conductivity type, which is the opposite of the first conductivity type.

The gate spacer 62 includes a dielectric material such as silicon oxide, silicon nitride, silicon oxynitride, or a combination thereof. The gate spacer 62 can be formed, for example, by deposition of a conformal dielectric material layer and an anisotropic etch that removes horizontal portions of the conformal dielectric material layer. The remaining vertical portions of the conformal dielectric material layer constitute the gate spacer 62. The thickness of the gate spacer 62, as measured at the base contacting the top semiconductor layer 33, can be from 10 nm to 120 nm, and typically from 20 nm to 60 nm, although lesser and greater thicknesses can also be employed.

The source region 36 and the drain region 38 can be formed, for example, by introducing electrical dopants into exposed semiconductor portions in the top semiconductor layer 33 employing the combination of the disposable gate stack structure (47, 57, 58) and the gate spacer 62 as a masking layer. The source region 36 and the drain region 38 have a same type of doping as the source extension region 32 and the drain extension region 34.

A raised source region 76 and a raised drain region 78 can be formed, for example, by selective epitaxy of a semiconductor material. In one embodiment, the raised source region 76 and a raised drain region 78 are in-situ doped with electrical dopants of the same conductivity type as the electrical dopants present in the source region 36 and the drain region 38 during the selective epitaxy. In another embodiment, the raised source region 76 and a raised drain region 78 are formed as intrinsic semiconductor portions, and are subsequently doped with electrical dopants of the same conductivity type as the electrical dopants present in the source region 36 and the drain region 38. The thickness of the raised source region 76 and a raised drain region 78 can be from 2 nm to 200 nm, and typically from 5 nm to 80 nm, although lesser and greater thicknesses can also be employed.

Figure 2:
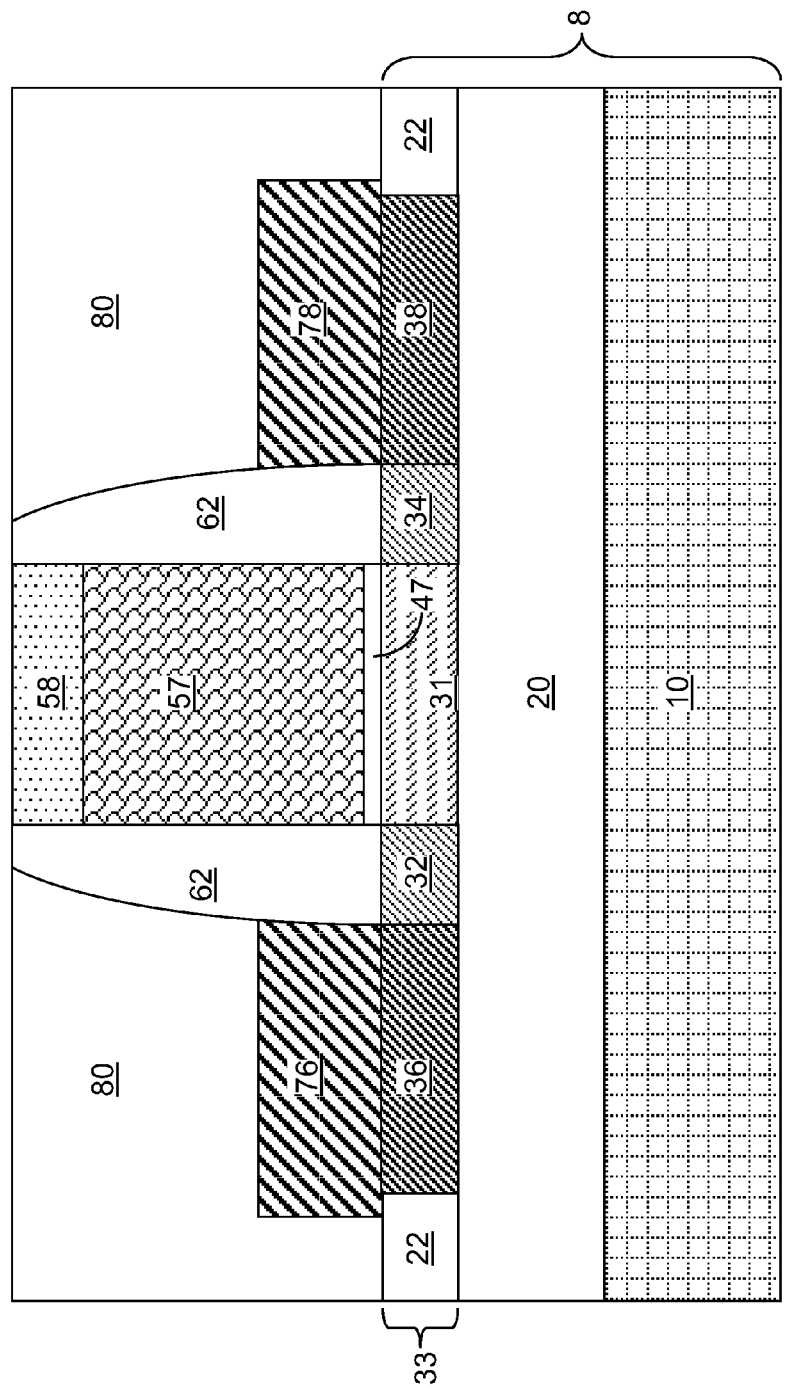
FIG. 2 is a vertical cross-sectional view of the exemplary semiconductor structure after deposition and planarization of a planarization dielectric layer according to an embodiment of the present disclosure.

Referring to FIG. 2, a planarization dielectric layer 80 is deposited over the disposable gate stack structure (47, 57, 58), the gate spacer 62, the raised source and drain regions (76, 78), and the exposed top surfaces of the top semiconductor layer 33, for example, by chemical vapor deposition (CVD). The planarization dielectric layer 80 includes a dielectric material such as silicon oxide, silicon nitride, silicon oxynitride, or a combination thereof. The planarization dielectric layer 80 is subsequently planarized so that a planar top surface of the planarization dielectric layer 80 is coplanar with a planar top surface of the disposable gate cap dielectric 58 and a planar top surface of the dielectric spacer 62.

In one embodiment, the planarization dielectric layer 80 includes a dielectric material that is different from the dielectric material of the disposable gate cap dielectric 58. The disposable gate cap dielectric 58 is employed as a stopping layer during the planarization of the planarization dielectric layer 80, for example, by chemical mechanical planarization (CMP).

Figure 3:
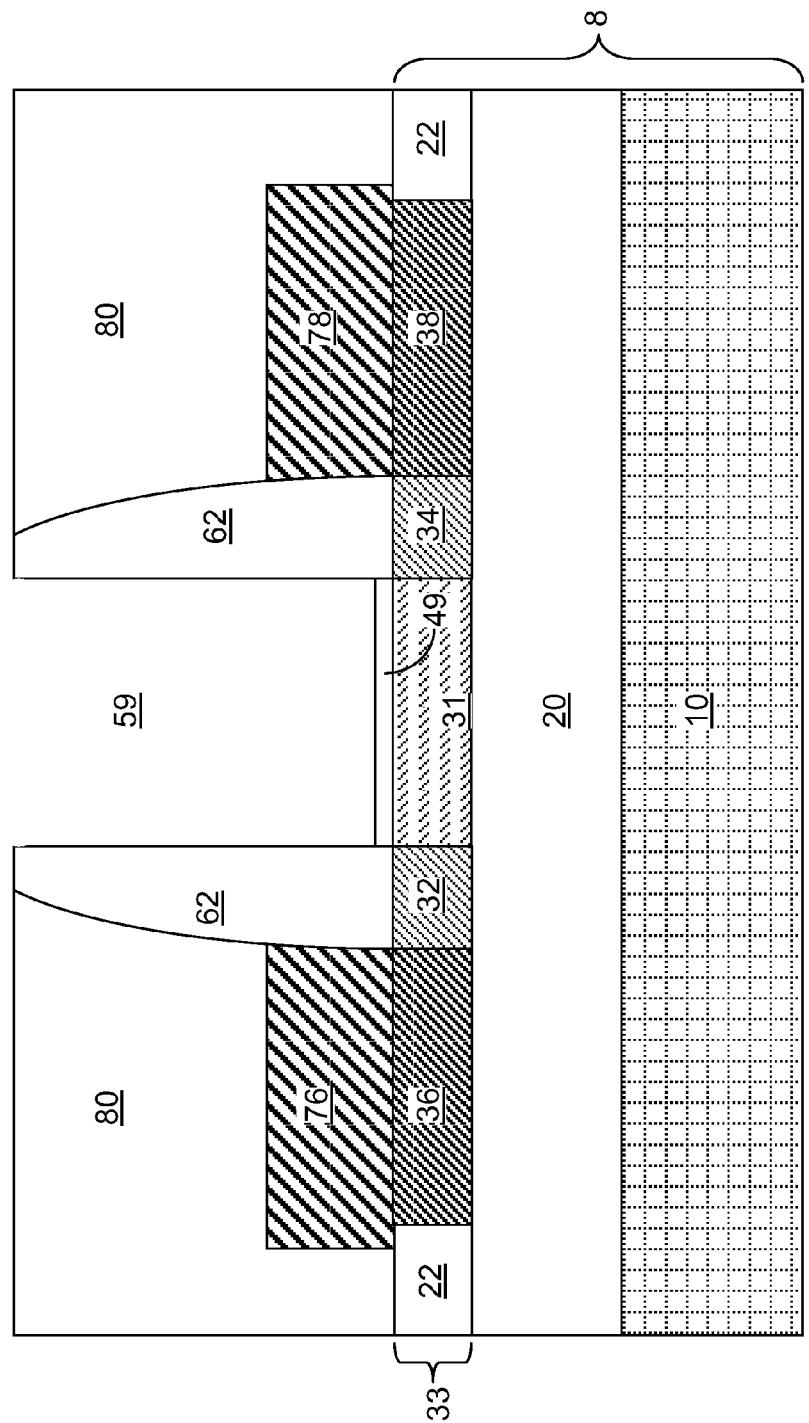
FIG. 3 is a vertical cross-sectional view of the exemplary semiconductor structure after removal of the disposable gate stack structure and formation of a chemical oxide layer according to an embodiment of the present disclosure.

Referring to FIG. 3, the disposable gate stack structure (47, 57, 58) is removed selective to the planarization dielectric layer 80 and the gate spacer 62. A gate cavity 59 laterally surrounded by the gate spacer 62 is formed in a volume from which the disposable gate stack structure (47, 57, 58) is removed. The inner sidewalls, which can be vertical sidewalls, of the gate spacer 62 are exposed after formation of the gate cavity 59.

Further, the top surface of the body portion 31 in the top semiconductor layer 33 can be exposed at the bottom of the gate cavity 59. Optionally, a chemical oxide layer 49 can be formed on the exposed semiconductor surface of the body portion 31 by conversion of a surface portion of the semiconductor material in the body portion 31 into a dielectric material. For example, the body portion 31 can include single crystalline silicon, and the chemical oxide layer 49 can include silicon oxide which is formed by thermal oxidation, chemical oxidation, plasma oxidation of the surface portion of silicon in the body portion 31. The thickness of the chemical oxide layer can be from 0.5 nm to 1.5 nm, although lesser and greater thicknesses can also be employed.

Figure 4:
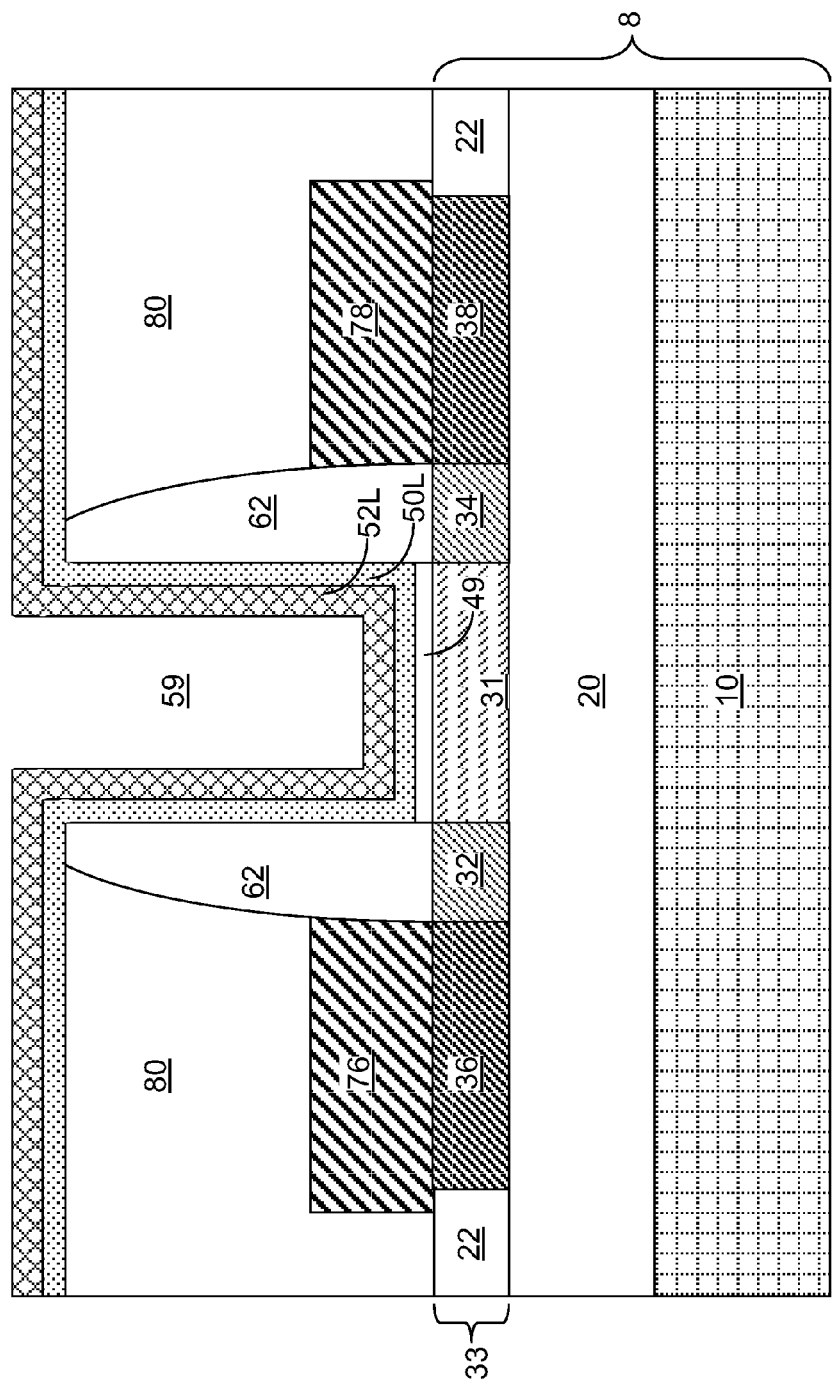
FIG. 4 is a vertical cross-sectional view of the exemplary semiconductor after formation of a high dielectric constant (high-k) gate dielectric layer and a metal nitride layer according to an embodiment of the present disclosure.

Referring to FIG. 4, a gate dielectric layer and a metal nitride layer 52L are sequentially deposited in the gate cavity 59 and over a top surface of the planarization dielectric layer 80. The gate dielectric layer includes a dielectric material having a dielectric constant greater than 8.0, and is herein referred to as a high dielectric constant (high-k) gate dielectric layer 50L. The high-k gate dielectric layer 50L is deposited directly on the inner sidewalls of the gate spacer 62 and the top planar surface of the planarization dielectric layer 80. If the gate spacer 62 includes a top planar surface, the high-k gate dielectric layer 50L is formed directly on the top planar surface of the gate spacer 62. If a chemical oxide layer 49 is present, the high-k gate dielectric layer 50L is deposited directly on the top surface of the chemical oxide layer 49. If a chemical oxide layer 49 is not present, the high-k gate dielectric layer 50L is deposited directly on the top surface of the body portion 31.

The high-k gate dielectric layer 50L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k gate dielectric layer 50L can be from 0.9 nm to 6 nm, and preferably from 1.0 nm to 3 nm, although lesser and greater thicknesses can also be employed.

A metal nitride layer 52L is deposited on the gate dielectric layer 50L, for example, by chemical vapor deposition (CVD), physical vapor deposition (PVD), atomic layer deposition (ALD), or a combination thereof. The metal nitride layer 52L includes a conductive metal nitride material, which can be, for example, titanium nitride, tantalum nitride, or tungsten nitride. The metal nitride layer 52L can consist essentially of a metal element and nitrogen.

In one embodiment, the metal nitride layer 52L is a stoichiometric metal nitride. For example, the metal nitride layer 52L can have the composition of TiN, TaN, or WN in which the atomic percentage of metal atoms is 50% and the atomic percentage of the nitrogen atoms is 50%. In one embodiment, the metal nitride layer 52L includes stoichiometric titanium nitride, i.e., TiN in which the atomic percentage of titanium is 50% and the atomic percentage of nitrogen atoms is 50%.

The thickness of the metal nitride layer 52L, as measured directly above a horizontal portion of the high-k gate dielectric layer 50L within the gate cavity 59 and as measured immediately after formation, can be from 1.5 nm to 3.0 nm, although lesser and greater thicknesses can also be employed. This thickness of the metal nitride layer 52L is herein referred to as an original thickness.

Figure 5:
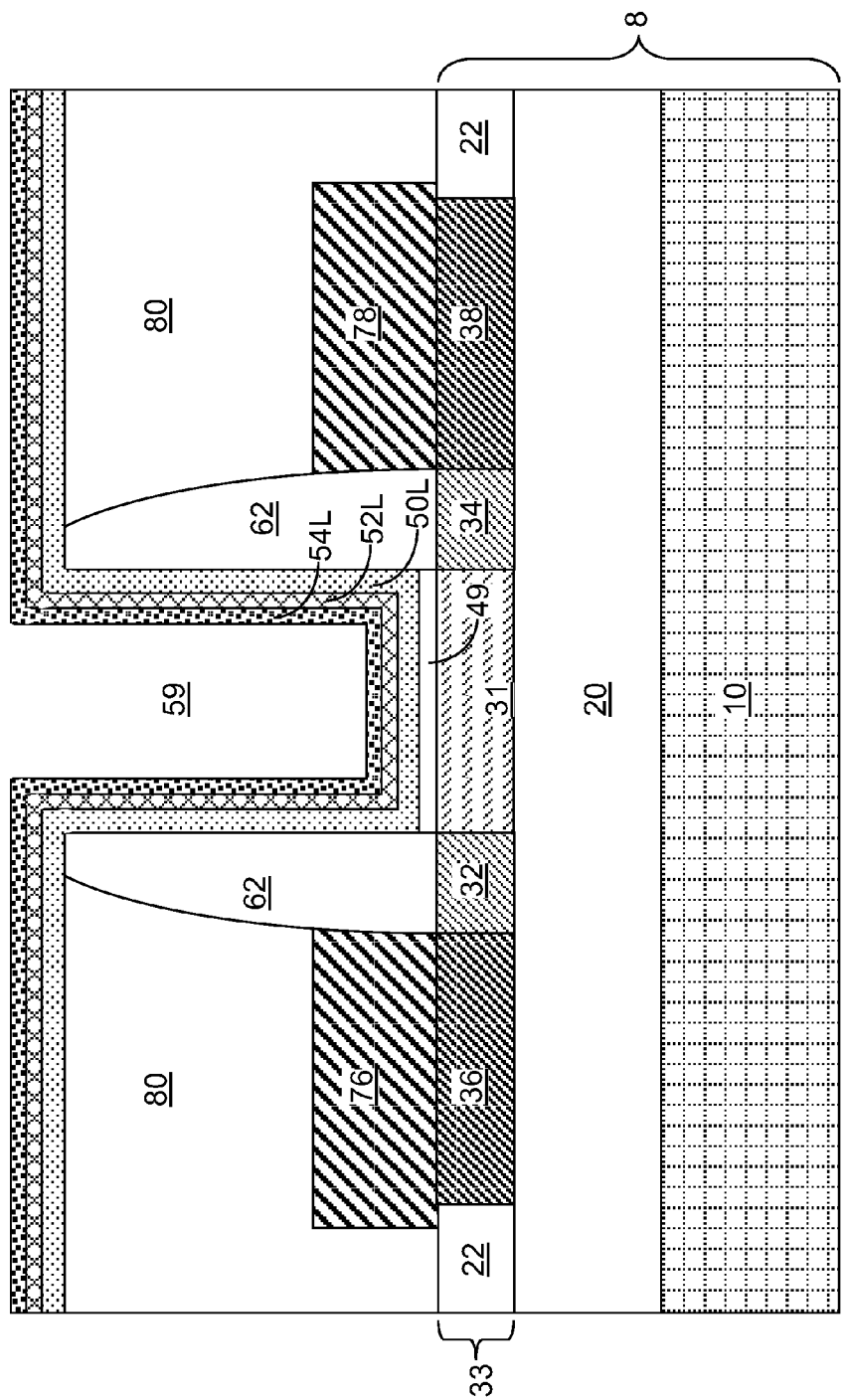
FIG. 5 is a vertical cross-sectional view of the exemplary semiconductor structure after conversion of a surface portion of the metal nitride layer into a metal oxynitride layer according to an embodiment of the present disclosure.

Referring to FIG. 5, a surface portion of the metal nitride layer 52L is converted into a metal oxynitride layer 54L. Thus, the metal nitride layer 52L as originally deposited becomes a stack, from top to bottom, of the metal oxynitride layer 54L and a thinned metal nitride layer 52L. The metal nitride layer 52L as thinned by conversion of the surface portion has a lesser thickness than the metal nitride layer than the original thickness of the metal nitride layer 52L.

In one embodiment, the metal oxynitride layer 54L can be formed by treating a physically exposed surface of the metal nitride layer 52L with ozonated water. The treatment of the physically exposed surface of the metal nitride layer 52L with ozonated water can be performed, for example, in a wet etch tank or in a sealed vessel configured to load the semiconductor substrate 8 and flow in ozonated water into the sealed vessel.

In another embodiment, the metal oxynitride layer 54L can be formed by treating a physically exposed surface of the metal nitride layer 52L with an oxidant-including solution. The oxidant-including solution is a solution that does not etch the metal nitride layer 52L. The oxidant-including solution can be a hydroxide-including solution. For example, the oxidant-including solution can include sodium hydroxide, potassium hydroxide, ammonium hydroxide, or a combination thereof.

The metal oxynitride layer 54L includes a conductive metal oxynitride material, which can be, for example, titanium oxynitride, tantalum oxynitride, or tungsten oxynitride. The metal oxynitride layer 54L can consist essentially of a metal element, nitrogen, and oxygen.

In one embodiment, the metal oxynitride layer 54L is a stoichiometric metal oxynitride. For example, the metal nitride layer 52L can have the composition of $TiN_{1-x}O_x$, $TaN_{1-x}O_x$, or $WN_{1-x}O_x$, in which the atomic percentage of metal atoms is 50% and the combined atomic percentage of the nitrogen atoms and the oxygen atoms is 50%. The value of x is a positive number that is less than 1.0. In one embodiment, the metal oxynitride layer 54L includes stoichiometric titanium oxynitride, i.e., $TiN_{1-x}O_x$ in which the atomic percentage of titanium is 50% and the combined atomic percentage of nitrogen atoms and oxygen atoms is 50%.

The thickness of the metal oxynitride layer 54L is self-limiting because the presence of the metal oxynitride layer 54L prevents further oxidation of the metal nitride layer 52L once the thickness of the metal oxynitride layer 54L reaches a critical thickness. The thickness of the metal oxynitride layer 54L, as measured directly above a horizontal portion of the metal nitride layer 52L within the gate cavity 59, can be from 0.5 nm to 1.5 nm, although lesser and greater thicknesses can also be employed. This thickness of the metal nitride layer 52L as thinned can be from 1.5 nm to 2.5 nm, although lesser and greater thicknesses can also be employed.

Figure 6:
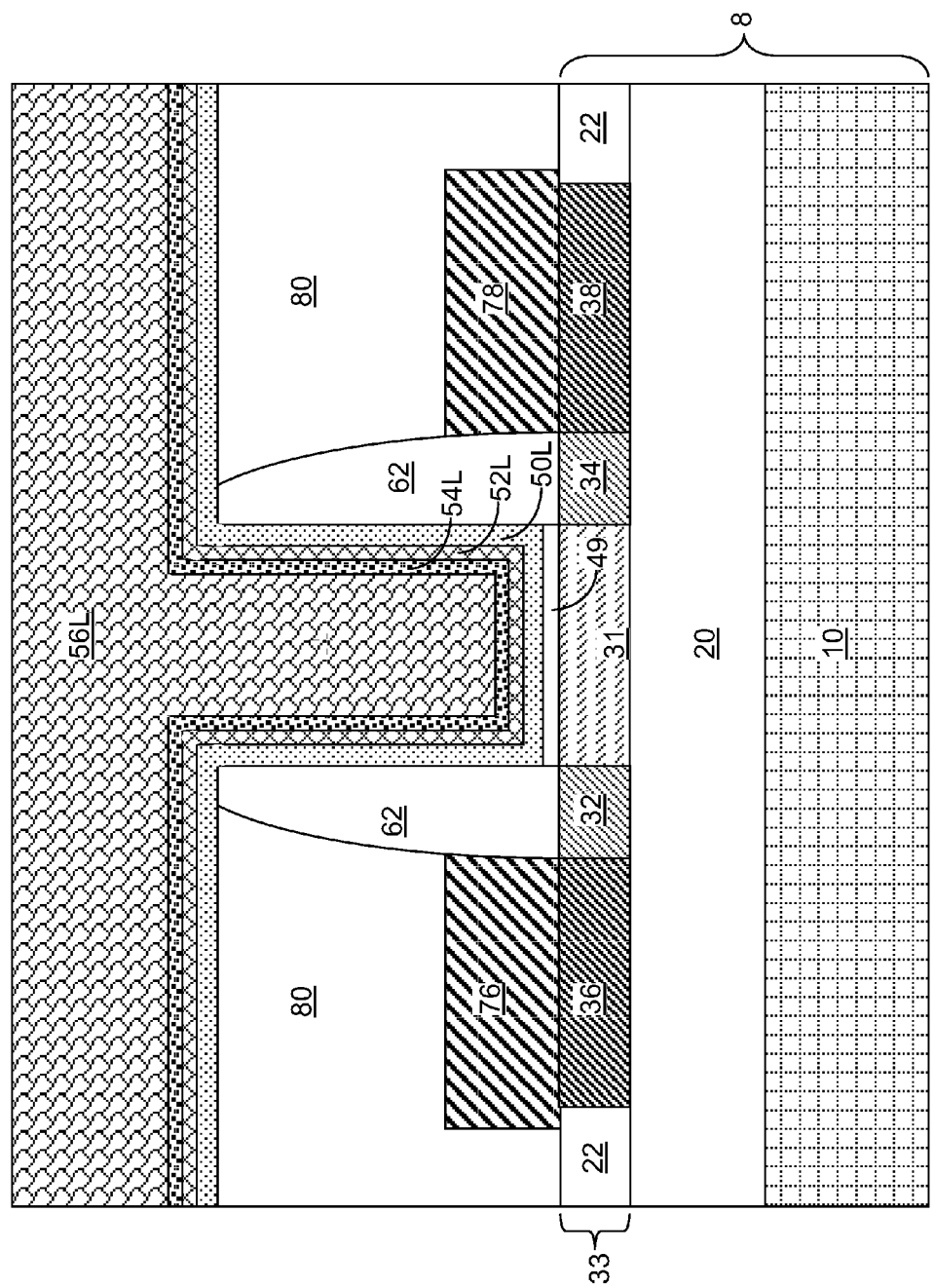
FIG. 6 is a vertical cross-sectional view of the exemplary semiconductor structure after formation of a conductive material layer according to an embodiment of the present disclosure.

Referring to FIG. 6, a conductive material layer 56L is deposited in the gate cavity 59 and over the topmost surface of the metal oxynitride layer 54L. The conductive material layer 54L includes a conductive material, which can be a doped semiconductor material, a metallic material, or a combination thereof. The doped semiconductor material, if employed, can be doped polysilicon, doped polycrystalline germanium, a doped silicon-germanium alloy, any other doped elemental or compound semiconductor material, or a combination thereof. The metallic material can be any metallic material that can be deposited by chemical vapor deposition (CVD), physical vapor deposition (PVD), or a combination thereof. For example, the metallic material can include aluminum and/or tungsten. The thickness of the conductive material layer 54L is selected to completely fills the gate cavity 59.

In one embodiment, the conductive material layer 56L can include a work function metallic layer (not shown separately). The work function metallic layer can include a metallic material that optimizes the performance of a field effect transistor by tuning the work function of the gate electrode. Metallic materials that can be included in the work function metallic layer 52L include, but are not limited to, Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, alloys thereof, conductive oxides thereof, conductive nitrides thereof, and any combinations of the foregoing.

Figure 7:
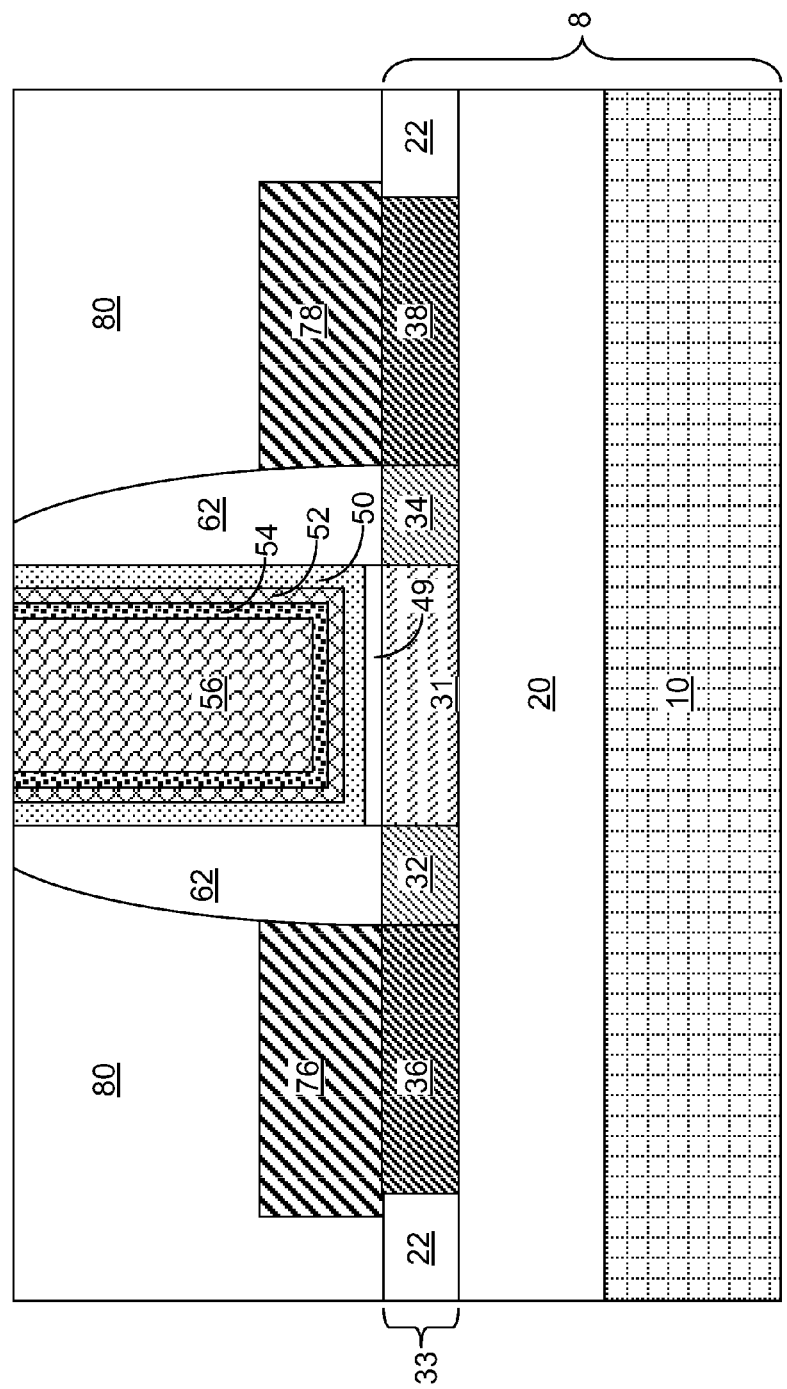
FIG. 7 is a vertical cross-sectional view of the exemplary semiconductor structure after planarization of gate materials from above a top surface of the planarization dielectric layer according to an embodiment of the present disclosure.

The materials of the high-k gate dielectric layer 50L, the metal nitride layer 52L, the metal oxynitride layer 54L, and the conductive material layer 56L are collectively referred to as gate materials. Referring to FIG. 7, the gate materials are removed from above a top surface of the planarization dielectric layer 80 by planarization, which can be performed by chemical mechanical planarization (CMP), recess etch, or a combination thereof. Thus, the portions of the conductive material layer 56L, the metal oxynitride layer 54L, the metal oxide layer 52L, and the high-k gate dielectric layer 50L are removed from above the top surface of the planarization dielectric layer 80. A remaining portion of the high-k gate dielectric layer 50L constitutes a U-shaped gate dielectric 50, a remaining portion of the metal nitride layer 52L constitutes a U-shaped metal nitride layer 52, a remaining portion of the metal oxynitride layer 54L constitutes a U-shaped metal oxynitride layer 54, and a remaining portion of the conductive material layer 56L constitutes a conductive material portion 56.

The U-shaped gate dielectric 50 includes a horizontal portion contacting the chemical oxide layer 49 or a top semiconductor surface of the body portion 31 and vertical portions having vertical sidewalls that contact the gate spacer 62. The U-shaped metal nitride layer 52 includes a horizontal portion contacting the horizontal portion of the U-shaped gate dielectric 50 and vertical portions contacting inner sidewalls of the U-shaped gate dielectric 50. The U-shaped metal oxynitride layer 54 includes a horizontal portion contacting the horizontal portion of the U-shaped metal nitride layer 52 and vertical portions contacting inner sidewalls of the U-shaped metal nitride layer 52. The conductive material portion 56 contacts the top surface of the horizontal portion of the U-shaped metal oxynitride layer 54 and inner sidewalls of the U-shaped metal oxynitride layer 54.

In one embodiment, the U-shaped metal nitride layer 52 can be a titanium nitride layer, a tantalum nitride layer, or a tungsten nitride layer. Correspondingly, the U-shaped metal oxynitride layer 54 can be a titanium oxynitride layer, a tantalum oxynitride layer, or a tungsten oxynitride layer.

The topmost surface of the U-shaped gate dielectric 50, the topmost surface of the U-shaped metal nitride layer 52, the topmost surface of the U-shaped metal oxynitride layer 54, and the topmost surface of the conductive material portion 56 can be coplanar with the top surface of the planarization dielectric layer 80 after planarization. The U-shaped metal oxide layer 52, the U-shaped metal nitride layer 54, and the conductive material portion 56 collectively constitute a gate electrode (52. 54. 56) of a field effect transistor. The gate spacer 62 laterally surrounds the gate electrode (52, 54, 56). The gate spacer 62 can have a top surface that is coplanar with the top surface of the planarization dielectric layer 80.

Figure 8:
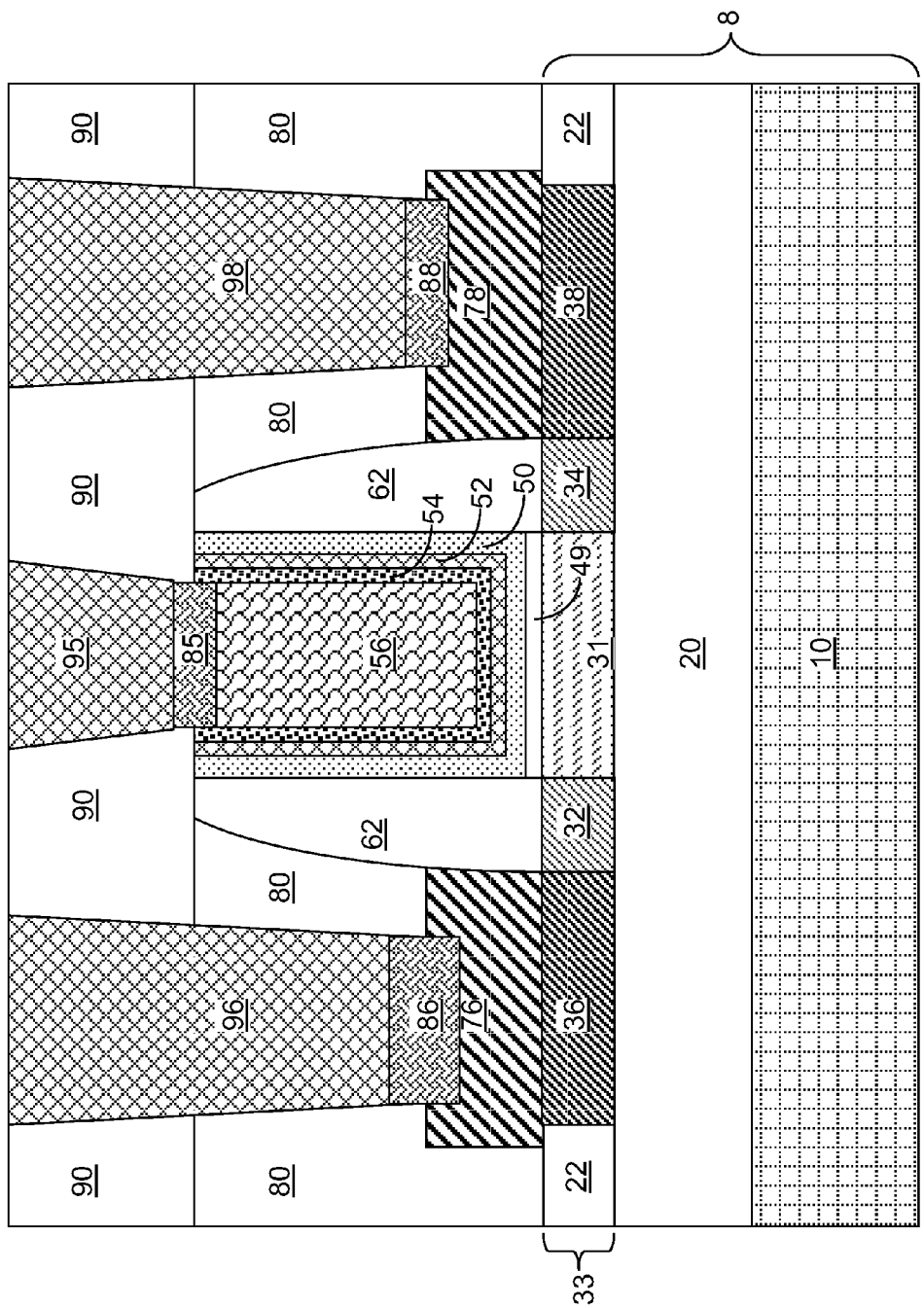
FIG. 8 is a vertical cross-sectional view of the exemplary semiconductor structure after formation of a contact level dielectric material layer and various contact via structures according to an embodiment of the present disclosure.

Referring to FIG. 8, a contact level dielectric material layer 90 is deposited over the gate electrode (52, 54, 56) and the planarization dielectric layer 80. The contact level dielectric material layer 90 includes a dielectric material that can be employed for forming metal interconnect structures therein. For example, the contact level dielectric material layer 90 can include silicon oxide, silicon nitride, silicon oxynitride, organosilicate glass, or a combination thereof. The contact level dielectric material layer 90 can be deposited, for example, by chemical vapor deposition (CVD). The thickness of the contact level dielectric material layer 90 can be from 50 nm to 500 nm, although lesser and greater thicknesses can also be employed.

An anneal can be performed to diffuse oxygen atoms out of the U-shaped metal oxynitride layer 54, through the U-shaped metal nitride layer 52, and into the U-shaped gate dielectric 50. The anneal can be performed, for example, at a temperature from 400° C. to 800° C. for a duration between 1 minute to 24 hours. A furnace anneal or a rapid thermal anneal (RTA) can be employed for the anneal.

Because the thickness of the metal oxynitride layer 54L is self-limiting during the oxidation of the surface portion of the metal nitride layer 52L, the amount of oxygen supplied from the U-shaped metal oxynitride layer 54 into the U-shaped gate dielectric 50 during the anneal is limited. The amount of oxygen supplied provided by the U-shaped metal oxynitride layer 54 is sufficient to compensate for oxygen deficiency in the U-shaped gate dielectric 50 that is caused by oxygen loss after deposition of the high-k gate dielectric layer 50L, but is not excessive to cause any significant increase in the effective oxide thickness of the U-shaped gate dielectric 50. Thus, the U-shaped metal oxynitride layer 54 can cure any oxygen deficiency in the U-shaped gate dielectric 50 and prevent instability in the threshold voltage of the field effect transistor employing the U-shaped gate dielectric 50, but does not cause any significant increase in the effective oxide thickness. The oxygen content in the U-shaped metal oxynitride layer 54 decreases during the anneal, but does not become zero after the anneal, i.e., the U-shaped metal oxynitride layer 54 remains a metal oxynitride material portion after the anneal.

Contact via holes are formed in the contact level dielectric material layer 90 and the planarization dielectric layer 80, and are filled with a conductive material to form various contact via structures. The various contact via structures can include, for example, a gate contact via structure 95, a source contact via structure 96, and a drain contact via structure 98. Various metal semiconductor alloy portions can be formed after formation of the various contact via holes and before formation of the various contact via structures (95, 96, 98), for example, by deposition of a metal layer, an anneal that induces reaction between the metal in the metal layer and underlying semiconductor materials, and removal of unreacted portions of the metal layer. The various metal semiconductor alloy portions can include, for example, a gate metal semiconductor alloy portion 85, a source metal semiconductor alloy portion 86, and a drain metal semiconductor alloy portion 88.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a semiconductor structure comprising:
  forming a disposable gate structure and a planarization dielectric layer on a semiconductor substrate;
  forming a gate cavity by removing said disposable gate structure while not removing said planarization dielectric layer;
  forming a gate dielectric layer in said gate cavity and over a top surface of said planarization dielectric layer;
  forming a metal nitride layer on said gate dielectric layer; and
  converting a surface layer of said metal nitride layer into a metal oxynitride layer, wherein a stack of said metal oxynitride layer and a thinned metal nitride layer having a lesser thickness than said metal nitride layer is formed.

2. The method of claim 1, wherein said metal oxynitride layer is formed by treating a surface of said metal nitride layer with ozonated water.

3. The method of claim 1, wherein said metal oxynitride layer is formed by treating a surface of said metal nitride layer with an oxidant-including solution.

4. The method of claim 3, wherein said oxidant-including solution includes at least one of sodium hydroxide, potassium hydroxide, and ammonium hydroxide.

5. The method of claim 1, further comprising forming raised source and drain regions on a semiconductor layer in said semiconductor substrate prior to forming said planarization dielectric layer.

6. The method of claim 1, further comprising forming a gate spacer on sidewalls of said disposable gate structure prior to forming said planarization dielectric layer, wherein inner sidewalls of said gate spacer are exposed after formation of said gate cavity.

7. The method of claim 6, wherein said gate dielectric layer is deposited directly on said inner sidewalls of said gate spacer.

8. The method of claim 1, wherein said gate dielectric layer includes a dielectric material having a dielectric constant greater than 8.0.

9. The method of claim 1, further comprising:
filling said gate cavity with a conductive material layer;
removing portions of said conductive material layer, said metal oxynitride layer, said metal oxide layer, and said gate dielectric layer from above said top surface of said planarization dielectric layer, wherein a remaining portion of said metal nitride layer constitutes a U-shaped metal nitride layer, and a remaining portion of said metal oxynitride layer constitutes a U-shaped metal oxynitride layer.

10. The method of claim 9, wherein said U-shaped metal nitride layer is a titanium nitride layer, and said U-shaped metal oxynitride layer is a titanium oxynitride layer.

* * * * *